United States Patent [19]

You

[11] Patent Number: 4,972,097

[45] Date of Patent: Nov. 20, 1990

[54] REFERENCE VOLTAGE GENERATING CIRCUIT IN SEMICONDUCTOR DEVICE

[75] Inventor: Jei H. You, Tangjingun, Rep. of Korea

[73] Assignee: Sam Sung Electronics Co., Ltd., Kwonsunggusuwon, Rep. of Korea

[21] Appl. No.: 340,910

[22] Filed: Apr. 20, 1989

[30] Foreign Application Priority Data

Jul. 11, 1988 [KR] Rep. of Korea .......................... 8606

[51] Int. Cl.[5] .............................................. H03K 3/01

[52] U.S. Cl. ................................ 307/296.8; 323/314

[58] Field of Search ..................... 307/296.8, 448, 451; 323/314, 315

[56] References Cited

U.S. PATENT DOCUMENTS 4,357,571 11/1982 Roessler ............................ 323/313

4,553,098 11/1985 Yoh et al. ......................... 307/296.8

4,683,416 7/1987 Bynum ............................... 323/314

4,698,789 10/1987 Iizuka .............................. 307/296.8

4,810,902 3/1989 Storti et al. ......................... 307/448

*Primary Examiner*—Stanley D. Miller

*Assistant Examiner*—T. Cunningham

*Attorney, Agent, or Firm*—Darby & Darby

[57] ABSTRACT

The reference voltage generating circuit in this invention for generating a constant reference voltage in a semiconductor device, is provided with a low voltage applying line for applying to the circuit a voltage less than a supply voltage, standby current controlling means connected to said low voltage applying line for reducing greatly the standby current flowing in the circuit, a resistance component connected to said standby current controlling means for forming said reference voltage, a reference voltage output line connected to a connection node between said standby current controlling means and said resistance component, and initial voltage forming means connected in parallel with said standby current controlling means between said low voltage applying line and said reference voltage output line.

9 Claims, 1 Drawing Sheet

FIG. 1 (Prior Art)
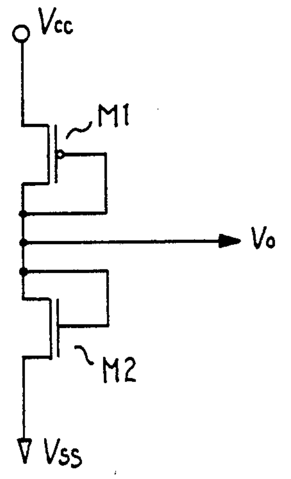
FIG. 2 (Prior Art)
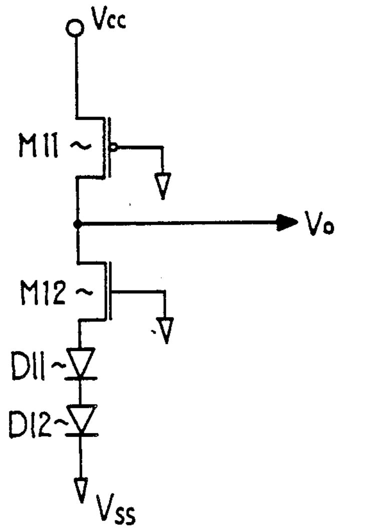
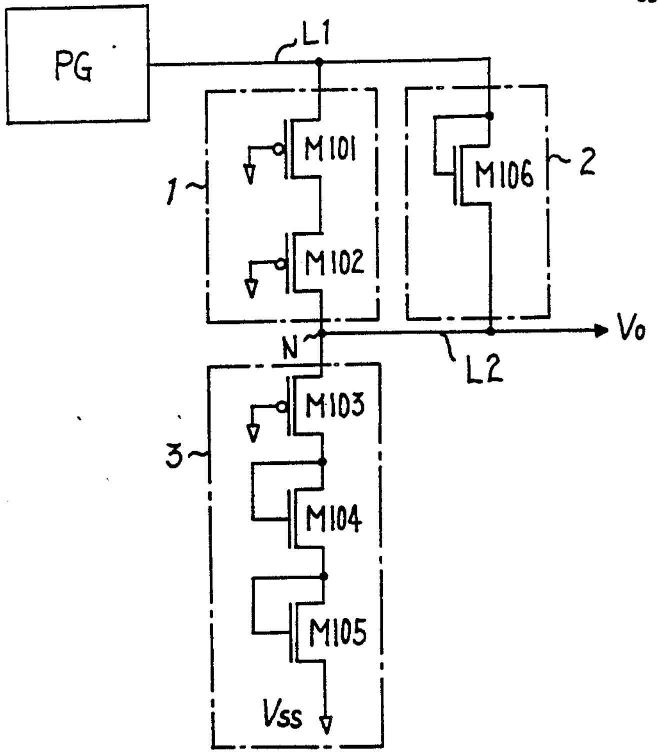
FIG. 3

REFERENCE VOLTAGE GENERATING CIRCUIT IN SEMICONDUCTOR DEVICE

BACKGROUND OF THE INVENTION

The present invention relates to a circuit for generating a constant reference voltage in a semiconductor device.

In the process of semiconductor device, a circuit for supplyng a constant reference voltage to a memory circuit of the semiconductor device, is required.

FIG. 1 is an example of such a conventional reference voltage generating circuit.

An enhancement-mode P type MOS transistor M1 connected to a supply voltage Vcc and an enhancement-mode N type MOS transistor M2 connected to a ground voltage Vss, is coupled in series as diode construction. The reference voltage Vo is taken out from the connecting point between M1 and M2.

Accordingly, N MOS transistor M2 performs a function for taking the reference voltage of low level, and P MOS transistor M1 performs a function for controlling the requisite reference voltage.

This circuit has, however, a problem that the reference voltage Vo varies sensitively due to variation of the supply voltage Vcc.

FIG. 2 is another example of the conventional reference voltage generating circuit.

In this circuit, a series path is formed by P MOS transistor M11, N MOS transistor M12 and N+- P+ junction diodes D11 and D12.

P and N MOS transistors M11 and M12 always turn on and a reference voltage is taken out from the connecting node between M11 and M12.

P and N MOS transistors perform reducing the standby current flowing in the circuit and a resistance component consisting of N MOS transistor M12 and N+- P+ juction diode D11 forms the reference voltage level.

Accordingly, this circuit can reduce variation of the reference voltage Vo due to variation of the supply voltage Vcc better than the circuit as shown by FIG. 1.

This circuit has, however, a problem that the standby current of several tens uA flows in this circuit because of a direct current path between the suppy voltage Vcc and the ground voltage Vss.

SUMMARY OF THE INVENTION

Accordingly, an object of the invention is to provide an improved reference voltage generating circuit which can minimize variation of the reference voltage due to variation of the supply voltage.

Another object of the invention is to provide an improved reference voltage generating circuit which can reduce greatly the standby current flowing in the circuit and form in a short time an initial voltage level.

In order to achieve the above odject the reference generating circuit in this invention is provided with a low voltage applying line for applying to the circuit a voltage less than a supply voltage, standby current controlling means connected to said low voltage applying line for reducing greatly the standby current flowing in the circuit, a resistance component connected to said standby current controlling means for forming said reference voltage, a reference voltage output line connected to a connecting node between said standby current controlling means and said resistance component, and initial voltage forming means connected in parallel with said standby current controlling means between said low voltage applying line and said reference voltage output line.

BRIEF DESCRIPTION OF THE DRAWINGS

The invention will be readily understood from the following more detailed description presented in conjunction whith the following drawings, in which:

FIG. 1 is a diagram showing a conventional reference voltage generating circuit;

FIG. 2 is a diagram showing another conventional reference voltage generating circuit;

FIG. 3 is a diagram showing a circuit of the invention.

DETAILED DESCRIPTION OF THE PREFERRED EMBODIMENTS

FIG. 3 is a diagram showing a circuit to which the present invention is applied.

A voltage generating means PG is formed in a memory device, and provides a half of a supply voltage Vcc or a voltage less than the supply voltage Vcc. The voltage is provided to the circuit of the invention through a low voltage applying line L1.

Providing the voltage less than the supply voltage Vcc to the circuit can obtain the stable reference voltage and reduce greatly the standby current in comparison with providing the supply voltage Vcc.

Besides, where this circuit of the invention uses a half of the supply voltage Vcc, it is possible to use the precharge voltage generator of bit line or the plate voltage of the DRAM cell.

One end of the low voltage applying line L1 connected to standby current controlling means 1 and initial voltage forming means 2. The standby controlling means 1 is mainly designed to perform a function for reducing greatly the standby current flowing in this circuit. In the preferred embodiment, the standby controlling means 1 comprises P MOS transistors M101 and M102 which are enhancement-mode.

The P MOS transistor M101 has a drain thereof connected to the low voltage applying line L1 and a gate thereof connected to a ground voltage and a source thereof connected to a drain of the second MOS transistor M102.

The P MOS transistor M102 has a gate thereof connected to the ground voltage. The first and second MOS transistors M101 and M102 always turn on under the voltage generated by low voltage generating means PG.

At this time, the P MOS transistors M101 and M102 control the standby current and the reference voltage.

Use of such P MOS transistors can minimize the current variation due to temperature variation and process variation in comparison with N MOS transistors or resistors.

The initial voltage forming means 2 is connected in parallel with the standby current controlling means, and comprises an enhancement-mode N type MOS transistor M106 which has a drain thereof connected to the low voltage applying line L1 and a gate thereof and a source thereof connected to a reference voltage output line L2.

The N MOS transistor M106 can form in short time an initial voltage level. That is, when the power source is first applied to the semiconductor chip, the N MOS transistor M106 performs a function for forming in a short time the threshold voltage Vt level to the low voltage applying line L1, since leakage current of the N MOS transistor M106 is small.

Also, diode construction consisting of two or more N MOS transistors can be used according to the reference voltage level.

A resistance component 3 is connected in series to the standby current controlling means.

The resistance component 3 performs a function for forming the reference voltage.

The reference voltage is formed by a voltage appearing across the resistance component 3.

In this embodiment, the resistance component 3 comprises P MOS transistor M103 and N MOS transistors M104 and M105 to which is connected in series. The P MOS transistor M103 and N MOS transistors M104 and M105 are enhancement-mode.

The P MOS transistor M103 has a drain thereof connected to the standby current controlling means and a gate thereof connected to the ground voltage and a source thereof connected to a drain of the N MOS transistor M104.

The N MOS transistor M104 has a gate thereof connected to the drain thereof and a source thereof connected to a drain of the N MOS transistor M105. The N MOS transistor N105 has a gate thereof connected to the drain thereof and a source thereof connected to the ground voltage.

P MOS transistor M103 performs a function for rising a little the reference voltage level.

The reason for using P MOS transistor M103 is the same as that for the above P MOS transistors M101 and M102.

Also, N MOS transistors M104 and M105 of a diode construction stabilize the reference voltage better than P+-N+ junction diodes or P MOS transistors from a process control point of view.

A reference voltage output line is connected to a connecting node N between the standby current controlling means 1 and the resistance component 3. The output voltage on the reference voltage output line is used as the voltage for operating a memory circuit, for example, the voltage for operating a row address buffer of Dynamic RAM.

What is claimed is:

1. A circuit for generating a constant reference voltage in a semiconductor device, the circuit comprising:
- a low voltage applying line for applying to the circuit a voltage less than a supply voltage;
- standby current controlling means connected to said low voltage applying line for reducing standby current flowing in the circuit;
- a resistance component connected to said standby current controlling means for forming said reference voltage, said constant referent voltage formed by a voltage appearing across said resistance component;
- a reference voltage output line connected to a connecting node between said standby current controlling means and said resistance component; and
- initial voltage forming means connected in parallel with said standby current controlling means between said low voltage applying line and said reference voltage output line for forming an initial voltage level to said low voltage applying line.

2. A circuit according to claim 1, wherein said standby current controlling means comprises first and second MOS transistors which form a series path.

3. A circuit according to claim 2, wherein said first and second MOS transistors are enhancement-mode P type MOS transistors, said first MOS transistor having a drain in electrical connection with said low voltage applying line and having a gate in electrical connection with a ground voltage and having a source in electrical connection with a drain of said second MOS transistor, said second MOS transistor having a gate thereof in electrical connection with the ground voltage said second MOS transistor having a source in electrical connection with the reference voltage output line.

4. A circuit according to claim 2, wherein said resistance component comprises third, fourth and fifth MOS transistors which form a series path.

5. A circuit according to claim 4, wherein said third MOS transistor is an enhancement-mode P type MOS transistor and said fourth and fifth MOS transistors are enhancement-mode N type MOS transistors, said third MOS transistor having a drain in electrical connection with said reference voltage output line and having a gate in electrical connection with a ground voltage and having a source in electrical connection with a drain of said fourth transistor, said fourth MOS transistor having a gate in electrical connection with the drain thereof and having a source in electrical connection with a drain of said fifth MOS transistor, said fifth MOS transistor having a gate in electrical connection with the drain thereof and having a source in electrical connection with the ground voltage.

6. A circuit according to claim 4, wherein said initial voltage forming means comprises a sixth MOS transistor.

7. A circuit according to claim 6, wherein said sixth MOS transistor is an enhancement-mode N type MOS transistor, said sixth MOS transistor having a drain in electrical connection with said low voltage applying line and with a gate thereof and having a source in electrical connection with said reference voltage output line.

8. A circuit according to claim 1, wherein the voltage on said low voltage applying line is a half of the supply voltage.

9. A circuit according to claim 1, wherein said initial voltage forming means comprises an N MOS transistor.

* * * * *